(12) United States Patent
Ahn (10) Patent No.: US 9,681,538 B2
(45) Date of Patent: Jun. 13, 2017

(54) FLEXIBLE DISPLAY

(71) Applicant: Samsung Display Co., Ltd., Yongin, Gyeonggi-do (KR)

(72) Inventor: Sung Sang Ahn, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 192 days.

(21) Appl. No.: 14/710,494

(22) Filed: May 12, 2015

(65) Prior Publication Data

US 2016/0143131 A1   May 19, 2016

(30) Foreign Application Priority Data

Nov. 14, 2014   (KR) .......................... 10-2014-0158976

(51) Int. Cl.
| H05K 5/00 | (2006.01) |
| H05K 1/02 | (2006.01) |
| G06F 1/16 | (2006.01) |
| H04M 1/02 | (2006.01) |
| H05K 5/02 | (2006.01) |

(52) U.S. Cl.
CPC ........... *H05K 1/028* (2013.01); *G06F 1/1616* (2013.01); *G06F 1/1652* (2013.01); *H04M 1/0237* (2013.01); *H04M 1/0268* (2013.01); *H05K 5/0017* (2013.01); *H05K 5/0204* (2013.01)

(58) Field of Classification Search
USPC .............................. 361/679.01, 600, 679.27
See application file for complete search history.

(56) References Cited

U.S. PATENT DOCUMENTS 8,824,150 B2 *   9/2014   Kang .................. H05K 1/0271
                                                         174/254
2006/0176243 A1   8/2006   Yeh
(Continued)

FOREIGN PATENT DOCUMENTS

KR   10-2010-0028343 A   3/2010
KR   10-2011-0088870 A   8/2011
(Continued)

OTHER PUBLICATIONS

Extended European Search Report for European Patent Application No. EP 15 194 242.2 which shares priority of Korean Patent Application No. KR 10-2014-0158976 with subject U.S. Appl. No. 14/710,494.

*Primary Examiner* — Andargie M Aychillhum
(74) *Attorney, Agent, or Firm* — Knobbe, Martens, Olson & Bear, LLP (57) ABSTRACT

A flexible display is disclosed. In one aspect, the flexible display includes a flexible display panel including: a first flat portion, a bending portion connected to the first flat portion, and a second flat portion connected to the bending portion and opposing the first flat portion. The flexible display also includes a guide member fixed to the flexible display panel and arranged between the first and second flat portions and a housing supporting the flexible display panel and the guide member and arranged between the first and second flat portions. The flexible display further comprises a sliding member connected to the housing and the guide member and configured to move the second flat portion by substantially the same distance as and in an opposite direction to the first flat portion when the first flat portion is moved.

17 Claims, 11 Drawing Sheets

(56) References Cited

U.S. PATENT DOCUMENTS

2012/0169223 A1* 7/2012 Moon ................ H01L 51/5246
                                                    313/512
2012/0314400 A1   12/2012 Bohn et al.
2013/0058063 A1    3/2013 O'Brien
2013/0174681 A1    7/2013 Hsu et al.

FOREIGN PATENT DOCUMENTS

| KR | 10-1107127 B1 | 1/2012 |
| KR | 10-2013-0028453 A | 3/2013 |
| KR | 10-1292974 B1 | 7/2013 |

* cited by examiner

FLEXIBLE DISPLAY

INCORPORATION BY REFERENCE TO ANY PRIORITY APPLICATIONS

This application claims priority to and the benefit of Korean Patent Application No. 10-2014-0158976 filed in the Korean Intellectual Property Office on Nov. 14, 2014, the entire contents of which are incorporated herein by reference.

BACKGROUND

Field

The described technology relates generally to a flexible display, and more particularly, to a flexible display using a semi-automatic sliding method.

Description of the Related Technology

Recently, flexible display panels having a display unit formed on a flexible substrate have been developed. The standard flexible display panel is maintained in a bent curved shape or is housed in a hinge type housing such that the display screen can be folded and unfolded.

Further, flexible display panels can be wound on a roller installed inside the housing. In this configuration, the flexible display panel is drawn out from the housing via a unidirectional rotation of the roller and returned into the housing via a reverse rotation of the roller. The flexible display panel can control the size of the display unit exposed to a user via extension and retraction of the flexible display panel.

SUMMARY OF CERTAIN INVENTIVE ASPECTS

One inventive aspect is a flexible display that can smoothly pull-out and retract a flexible display panel without applying a stress to the flexible display panel even without a power apparatus.

Another aspect is a flexible display including a flexible display panel, a guide member, a housing, and a sliding member. The flexible display panel may include a first flat portion, a bending portion connected to the first flat portion, and a second flat portion connected to the bending portion and facing the first flat portion. The guide member may be fixed to the inside of the flexible display panel. The housing may support the flexible display panel and the guide member inside the guide member. The sliding member may be installed to be connected to the housing and the guide member inside the housing and move the second flat portion to the same distance in an opposite direction to the first flat portion by transferring a force when the user pulls or pushes the first flat portion to the second flat portion.

The flexible display panel may be folded in a length direction, and the first flat portion, the bending portion, and the second flat portion may be sequentially positioned in the length direction. The flexible display panel may include a flexible substrate and a display unit formed on the flexible substrate. A portion corresponding to the first flat portion in the display unit may function as a display area.

The sliding member may include a first shaft of which one end is fixed to the first flat portion through the guide member and which is compressible and extendable, a gear box including a first gear rotating in conjugation with the first shaft and a second gear rotating by engaging with the first gear, and a second shaft which is connected to the second gear, of which one end is fixed to the second flat portion through the guide member, and which is compressible and extendable.

The guide member may include a first plate overlapping with the first flat portion and fixed to the first flat portion, a second plate fixed to the edge of the second flat portion, and a band-shaped connecting portion connecting the first plate and the second plate. One end of the first shaft and one end of the second shaft may be fixed to the first plate and the second plate, respectively. The flexible display panel may include a printed circuit board which is connected with the edge of the second flat portion and overlaps with the second plate.

The housing may include a curved portion, and the bending portion and the connecting portion may contact the curved portion. The housing may include a supporter to which a third flat portion, the curved portion, and a fourth flat portion are integrally connected, and a pair of side portions fixed to both sides of the supporter. A guide protrusion overlapping with the edge of the flexible display panel may be formed along the edge of the supporter.

The third flat portion may be positioned inside the first plate, and the fourth flat portion may be positioned inside the second flat portion and the second plate. A first opening and a second opening for installing the sliding member may be formed in the third flat portion and the fourth flat portion, respectively.

The first shaft may include a first fixing portion fixed to the first plate, a first rotating portion connected to the first gear, a first compress spring connecting the first fixing portion and the first rotating portion. The second shaft may include a second fixing portion fixed to the second plate, a second rotating portion connected to the second gear, and a second compress spring connecting the second fixing portion and the second rotating portion.

A pair of first pins fixed to the first fixing portion and the first rotating portion, respectively may be positioned inside the first compress spring, and a pair of second pins fixed to the second fixing portion and the second rotating portion, respectively may be positioned inside the second compress spring.

The gear box may be fixed to the housing and form two spaces for receiving the first gear and the second gear. The space for receiving the first gear of the two spaces may be opened upward and the space for receiving the second gear may be opened downward. The first rotating portion and the second rotating portion may be connected to the top of the first gear and the bottom of the second gear, respectively, and the first shaft and the second shaft may have a difference in height.

The first flat portion may be slid in a first direction by a pulling force of the user to have a maximum area in the opened state and slid in a second direction which is opposite to the first direction by a pushing force of the user to have a minimum area in the closed state.

When the first flat portion is slid in the first direction, the first gear and the second gear may rotate in an opposite direction while the first shaft is compressed and then extended and the second flat portion may be slid in the second direction while the second shaft is compressed and then extended.

When the first flat portion is slid in the second direction, the first gear and the second gear may rotate in an opposite direction while the first shaft is compressed and then extended and the second flat portion may be slid in the first direction while the second shaft is compressed and then extended.

Another aspect is a flexible display including a flexible display panel, a housing, and a sliding member. The flexible display panel may include a first flat portion, a bending portion connected to the first flat portion, and a second flat portion connected to the bending portion and facing the first flat portion. The housing may support the flexible display panel inside the flexible display panel. The sliding member may include a first shaft of which one end is fixed to the first flat portion and which is compressible and extendable, a first gear connected to the other end of the first shaft, a second gear rotating by engaging with the first gear, and a second shaft of which both ends are connected to the second flat portion and the second gear, respectively, and which is compressible and extendable.

A force when a user pulls or pushes the first flat portion may be transferred to the second flat portion by pivoting the first shaft, rotating the first gear and the second gear, and pivoting the second shaft, and the second flat portion may move by the same distance in the opposite direction to the first flat portion. The first gear and the second gear may be fixed to the housing.

Another aspect is a flexible display, comprising a flexible display panel including: i) a first flat portion, ii) a bending portion connected to the first flat portion, and iii) a second flat portion connected to the bending portion and opposing the first flat portion; a guide member fixed to the flexible display panel and arranged between the first and second flat portions; a housing supporting the flexible display panel and the guide member and arranged between the first and second flat portions; and a sliding member connected to the housing and the guide member and configured to move the second flat portion by substantially the same distance as and in an opposite direction to the first flat portion when the first flat portion is moved.

In exemplary embodiments, the flexible display panel is folded in a length direction thereof and wherein the first flat portion, the bending portion, and the second flat portion are sequentially arranged. The flexible display panel can include a flexible substrate and a display unit formed over the flexible substrate and a portion of the display unit corresponding to the first flat portion can be configured to display an image.

In exemplary embodiments, the sliding member comprises a first shaft having a first end fixed to the first flat portion via the guide member, wherein the first shaft is compressible and extendable; a gear box including: i) a first gear configured to rotate with the first shaft and ii) a second gear engaged with the first gear; and a second shaft connected to the second gear and having a first end fixed to the second flat portion via the guide member, wherein the second shaft is compressible and extendable. The guide member can comprise a first plate overlapping and fixed to the first flat portion; a second plate fixed to an edge of the second flat portion; and a connecting portion connecting the first plate to the second plate, wherein the first end of the first shaft and the first end of the second shaft are respectively fixed to the first plate and the second plate.

In exemplary embodiments, the flexible display panel includes a printed circuit board connected to the edge of the second flat portion and overlapping the second plate. The housing can include a curved portion and the bending portion and the connecting portion can contact the curved portion. The housing can comprise a support comprising a third flat portion, the curved portion, and a fourth flat portion which are integrally connected; a pair of side portions fixed to opposing sides of the support; and a guide protrusion overlapping an edge of the flexible display panel and formed along at least one of the side portions.

In exemplary embodiments, the third and fourth flat portions are interposed between the first and second plates wherein a first opening and a second opening are respectively formed in the third flat portion and the fourth flat portion, and wherein the sliding member is placed in the first and second openings. The first shaft can comprise a first fixing portion fixed to the first plate; a first rotating portion connected to the first gear; and a first compression spring connecting the first fixing portion to the first rotating portion, wherein the second shaft comprises: a second fixing portion fixed to the second plate; a second rotating portion connected to the second gear; and a second compression spring connecting the second fixing portion to the second rotating portion.

In exemplary embodiments, the first shaft further comprises a pair of first pins respectively fixed to the first fixing portion and the first rotating portion, wherein the pair of first pins are positioned inside the first compression spring, wherein the second shaft further comprises a pair of second pins respectively fixed to the second fixing portion and the second rotating portion, and wherein the pair of second pins are positioned inside the second compression spring. The gear box can be fixed to the housing and defines two spaces for respectively housing the first gear and the second gear. The space housing the first gear and the space housing the second gear can be opened in opposing directions, the first and second rotating portions can be respectively connected to opposing sides of the first and second gears, and the first shaft and the second shaft can be arranged at different heights.

In exemplary embodiments, the first flat portion is configured to be: i) slid in a first direction via a pulling force so as to have a maximum area in an opened state and ii) slid in a second direction opposite to the first direction via a pushing force so as to have a minimum area in a closed state. When the first flat portion is slid in the first direction: i) the first gear and the second gear can rotate in opposing directions, ii) the first shaft can be compressed and then extended, iii) the second flat portion can be slid in the second direction, and iv) the second shaft can be compressed and then extended.

In exemplary embodiments, when the first flat portion is slid in the second direction: i) the first gear and the second gear rotate in opposing directions, ii) the first shaft is compressed and then extended, iii) the second flat portion is slid in the first direction, and iv) the second shaft is compressed and then extended.

Another aspect is a flexible display comprising a flexible display panel including: i) a first flat portion, ii) a bending portion connected to the first flat portion, and iii) a second flat portion connected to the bending portion and opposing the first flat portion; a housing supporting the flexible display panel; and a sliding member including: a first shaft having a first end fixed to the first flat portion, wherein the first shaft is compressible and extendable; a first gear connected to a second end of the first shaft; a second gear rotatably engaged to the first gear; and a second shaft having a first end connected to the second flat portion and a second end connected to the second gear, wherein the second shaft is compressible and extendable.

In exemplary embodiments, when a user exerts a force on the first flat portion: i) a least a portion of the force is transferred to the second flat portion via the sliding member and ii) the second flat portion moves by substantially the same distance and in the opposite direction to the first flat portion. The first gear and the second gear can be fixed to the housing.

According to at least one embodiment, the flexible display does not require the inclusion of a power source for extension and retraction of the flexible display panel and can prevent deformation by minimizing the stress applied to the flexible display panel, thereby increasing its lifespan. Further, the flexible display according to at least one embodiment operates by the semi-automatic sliding method, and as a result, a similar effect to an existing keypad-type sliding phone can be provided.

DETAILED DESCRIPTION OF CERTAIN INVENTIVE EMBODIMENTS

Flexible display panels can be wound on a roller so as to be easily unrolled or extended via a pulling force exerted on the display by a user. However, when the user retracts the flexible display panel back onto the roller by pushing the unfolded flexible display panel (e.g., by applying a force in an opposite direction to the pulling force), the flexible display panel can be deformed. When a tensile force is applied to the display panel, it can be smoothly extended. However, when a compressive force is applied to the display panel, it is not smoothly retracted, deformation can result.

Accordingly, in the standard flexible display a power source such as a step motor or a hydraulic pump is installed on the roller and the unfolded flexible display panel is wound by rotating the roller with applied power. As a result, deformation can be reduced or prevented. However, in the flexible display including power, the entire configuration is complicated and battery life can be shortened.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" generally refers to positioning on or below an object portion and does not strictly refer to positioning on the upper side of the object portion based on the direction of gravity.

Throughout the specification and the claims, unless explicitly described to the contrary, the word "comprise" and variations such as "comprises" or "comprising" will be understood to imply the inclusion of stated elements but not the exclusion of any other elements. In addition, the size and thickness of each configuration shown in the drawings may be exaggerated for the sake of clarity and ease of description, but the present disclosure is not limited thereto.

Figure 1:
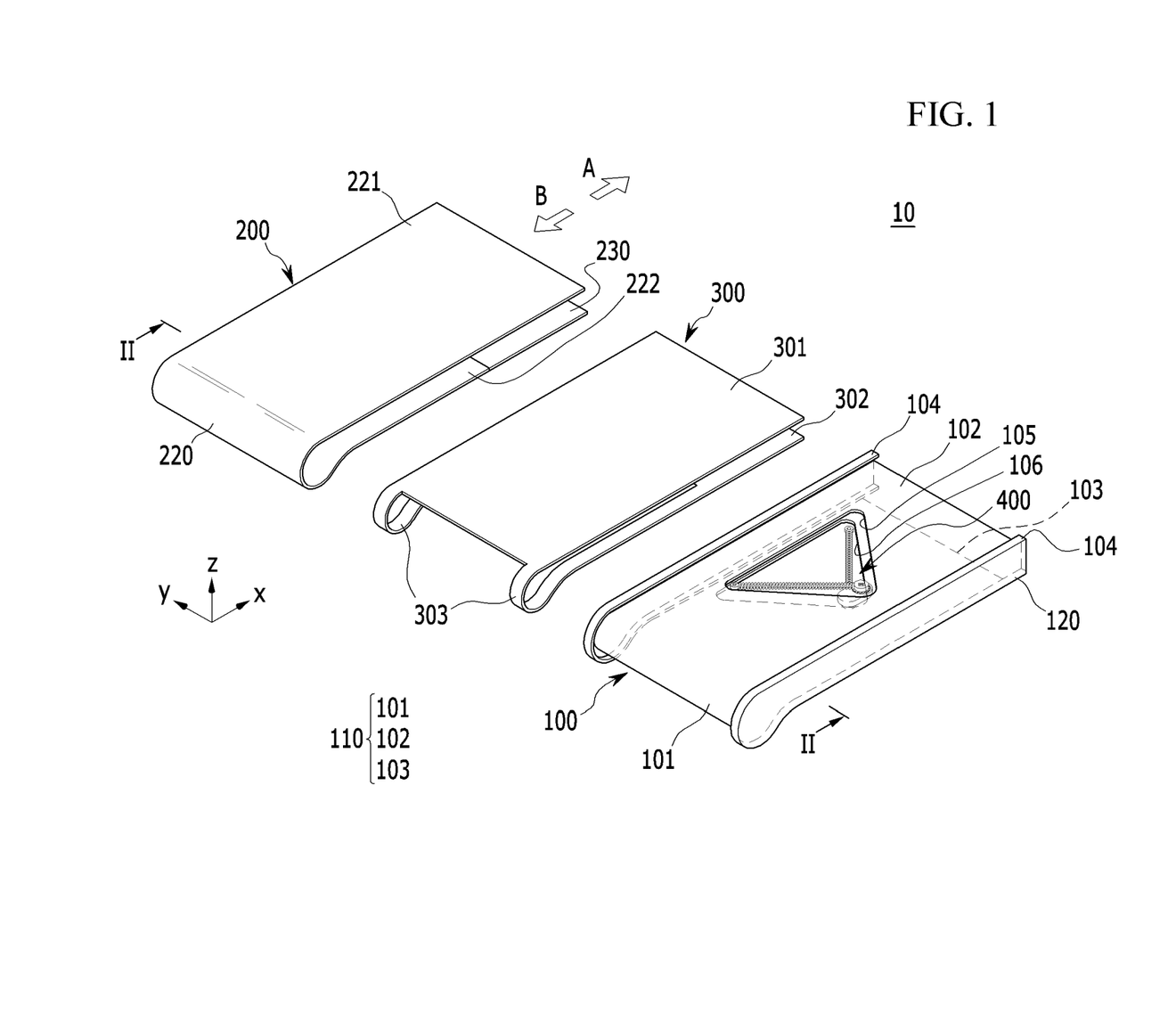
FIG. 1 is an exploded perspective view of a flexible display according to an exemplary embodiment.
Figure 2:
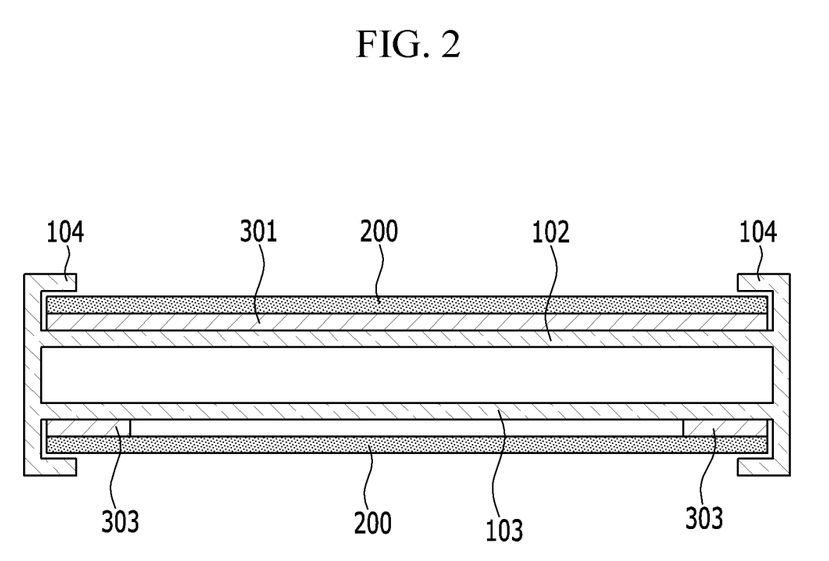
FIG. 2 is a cross-sectional view of the flexible display illustrated in FIG. 1.

FIG. 1 is an exploded perspective view of a flexible display according to an exemplary embodiment. FIG. 2 is a cross-sectional view of the flexible display illustrated in FIG. 1, which illustrates a cross section taken along line II-II of FIG. 1.

Referring to FIGS. 1 and 2, a flexible display 10 includes a housing 100, a flexible display panel 200 and a guide member 300 supported by the housing 100. The flexible display 10 also includes a sliding member 400 connected to the housing 100 and the guide member 300 inside the housing 100. The flexible display 10 of the exemplary embodiment of FIG. 1 operates by a semi-automatic sliding method.

The flexible display panel 200 includes a flexible substrate such as a plastic film and displays an image via a plurality of pixels formed on the flexible substrate. The flexible display panel 200 may be embodied as any one of an organic light-emitting diode (OLED) display panel, a liquid crystal display (LCD) panel, and an electrophoretic display (EPD) panel.

Figure 3:
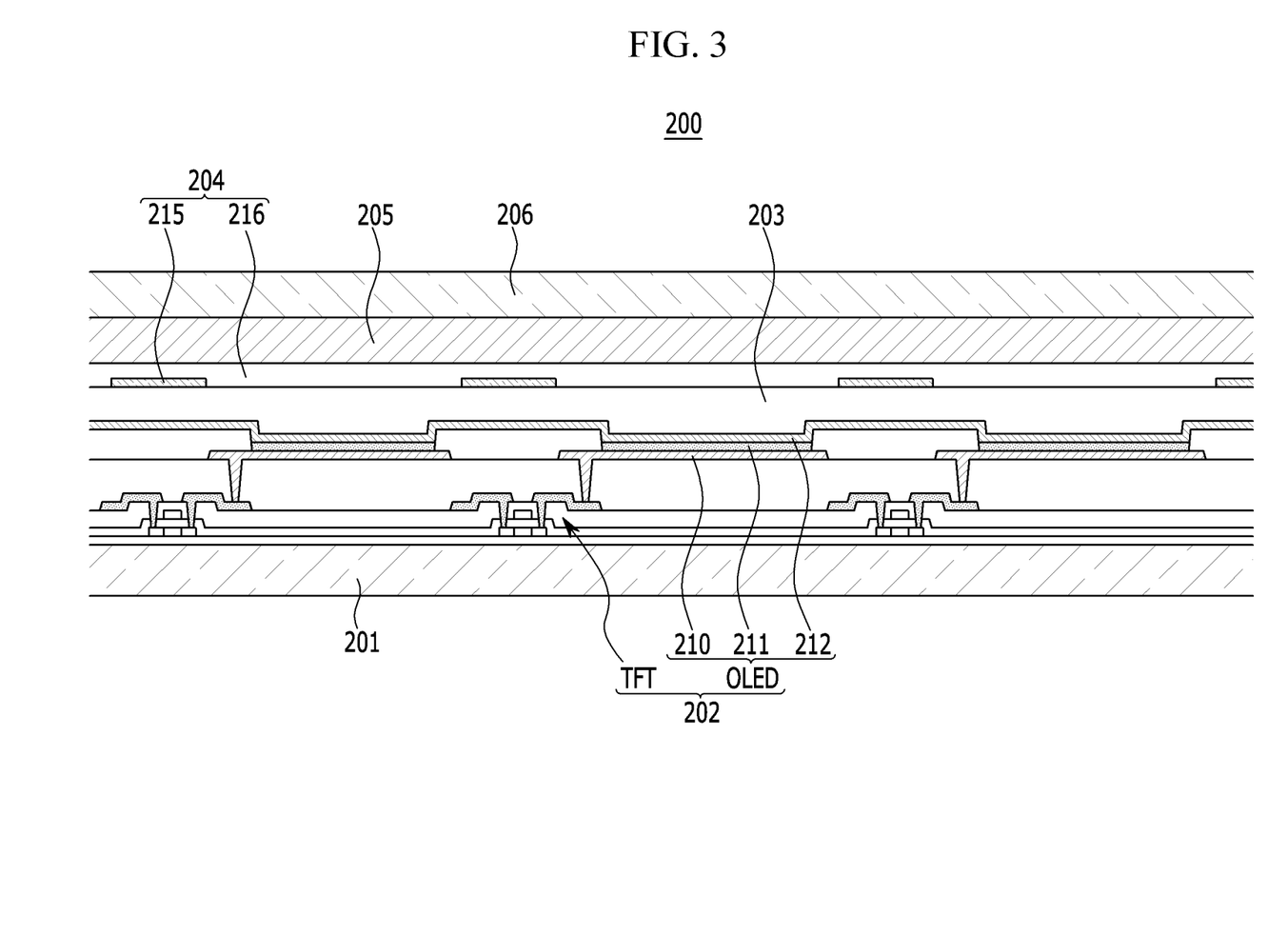
FIG. 3 is a schematic cross-sectional view illustrating an embodiment where the flexible display panel illustrated in FIG. 1 is an organic light-emitting diode (OLED) display panel.

FIG. 3 is a schematic cross-sectional view illustrating an embodiment where the flexible display panel illustrated in FIG. 1 is an OLED display panel.

Referring to FIG. 3, the flexible display panel 200 includes a flexible substrate 201, a plurality of thin film transistors (TFTs) and a plurality of OLEDs which are formed on the flexible substrate 201. The flexible display panel 200 also includes a sealing unit 203 covering the OLEDs, a touch sensor unit 204 formed on the sealing unit 203, an optical film unit 205, and a cover window 206. The TFTs and the OLEDs together form the display unit 202.

The TFT is included in a pixel circuit together with a storage capacitor (not illustrated). In some embodiments, OLEDs include a pixel electrode 210 connected to the thin film transistor TFT, an organic emission layer 211 formed on the pixel electrode 210, and a common electrode 212 formed over the entire display area on the organic emission layer 211.

The pixel electrode 210 can be a hole injection electrode (an anode), and the common electrode 212 can be an electron injection electrode (a cathode). A hole injected from the anode and an electron injected from the cathode are recombined with each other in the organic emission layer 211 to generate an exciton and light is emitted by energy generated when the exciton drops from an excited state to a ground state.

The sealing unit 203 seals the OLED to prevent external moisture and/or oxygen from penetrating to the OLED. In some embodiments, the sealing unit 203 includes a thin film encapsulation layer formed by laminating at least one inorganic layer and at least one organic layer.

The touch sensor unit 204 includes a plurality of sensing electrodes 215 and an insulating layer 216 covering the sensing electrodes 215. The touch sensor unit 204 provides a touch sensing functionality. The optical film unit 205 reduces the reflection of external light to improve screen contrast. The relative positions of the touch sensor unit 204 and the optical film unit 205 can be changed. The cover window 206 protects the components below the cover window 206 from external impact, scratches, or the like.

Referring to FIGS. 1 and 2, the flexible display panel 200 has a rectangular shape in which a width direction (y-axial direction) and a length direction (x-axial direction) are set and is folded in the length direction. The flexible display panel 200 includes a bending portion 220, a first flat portion 221 connected to one side of the bending portion 220, and a second flat portion 222 connected to the other side of the bending portion 220.

The housing 100 includes a curved portion 101 having a predetermined curvature. The bending portion 220 contacts the curved portion 101 and has a predetermined curvature corresponding to the curved portion 101. In some embodiments, first flat portion 221 and the second flat portion 222 are substantially parallel. The first flat portion 221, the bending portion 220, and the second flat portion 222 are sequentially positioned in the length direction of the flexible display panel 200.

The display unit 202 (see FIG. 3) is formed on an outer surface of the folded flexible display panel 200. The first flat portion 221 and the second flat portion 222 face each other (or oppose each other) and overlap each other in a vertical direction (a z-axial direction). Referring to FIG. 1, an exposed portion of the display unit 202 of the flexible display panel 200 (the entire first flat portion 221 and a part of the bending portion 220) can be observed by a user and can function as an actual display area.

The flexible display panel 200 can further include a semiconductor chip package (not illustrated) such as a chip on film and a printed circuit board 230. The semiconductor chip package includes a driving chip functioning as a scan driver and/or a data driver and the printed circuit board 230 outputs control signals for controlling the driving chip. The printed circuit board 230 is connected to an edge of the second flat portion 222 to overlap the first flat portion 221.

The first flat portion 221 is slid in a predetermined direction and thus an area thereof is changed. For example, the first flat portion 221 is slid in a first direction (arrow A) via a pulling force of the user to have a maximum area (an opened state) and is reversely slid in an opposite direction (second direction, arrow B) to the first direction by a pushing force of the user to have a minimum area (a closed state).

The display area has a maximum size in the opened state and has a minimum size in the closed state. The first direction and the second direction coincide with the length direction of the flexible display panel 200.

In this process, the second flat portion 222 has substantially the same moving distance as the first flat portion 221 due to a sliding member 400 to be described below and is automatically slid in an opposite direction to the first flat portion 221. In FIG. 1, the flexible display panel 200 is illustrated in the closed state and a sliding operation of the flexible display panel 200 will be described below in detail.

The guide member 300 is fixed to the inside of the flexible display panel 200 to guide the extension and retraction (opening and closing operation) according to the length direction of the flexible display panel 200. The guide member 300 includes a first plate 301 fixed to the first flat portion 221, a second plate 302 spaced apart from the first plate 301 and fixed to the second flat portion 222, and a connecting portion 303 connecting the first plate 301 to the second plate 302.

In the closed state of the flexible display panel 200, the portion defined as the first flat portion 221 is maintained in a flat state regardless of the extension and retraction. Further, in the closed state, the portion defined as the bending portion 220 and the portion defined as the flat portion 222 are deformed during the extension and retraction and unfolded to be flattened or curved to correspond to the curved portion 101.

The first plate 301 is formed with a size corresponding to the first flat portion 221 in the closed state to stably support the first flat portion 221. The second plate 302 is fixed to the edge of the second flat portion 222 and may be formed with a size corresponding to the printed circuit board 230. The connecting portion 303 is formed to be parallel to the length direction of the flexible display panel 200 and connects both edges of the first plate 301 and the second plate 302.

The first plate 301 and the second plate 302 overlap each other in the vertical direction and the connecting portion 303 includes a bending portion covering ½ or more of the curved portion 101. During the extension and retraction of the flexible display panel 200, the first plate 301 and the second plate 302 are slid in conjunction with the flexible display panel 200 and the connecting portion 303 is deformed and thus the position of the bending portion covering the curved portion 101 is changed.

The housing 100 includes a supporter or support 110 to which a third flat portion 102, the curved portion 101, and a fourth flat portion 103 are integrally connected. A pair of side portions 120 are fixed to both sides of the supporter 110. The third flat portion 102 is positioned inside the first plate 301 and the fourth flat portion 103 is positioned inside the second flat portion 222 and the second plate 302. The first plate 301 is slid while contacting the top of the third flat portion 102 and the second plate 302 is slid while contacting the bottom of the fourth flat portion 103.

In this embodiment, a guide protrusion 104 is formed along the edge of the supporter 110. The guide protrusion 104 overlaps the edge of the flexible display panel 200 so that the flexible display panel 200 and the guide member 300 do not deviate from the housing 100.

A first opening 105 and a second opening 106 in which the sliding member 400 is arranged are respectively formed in the third flat portion 102 and the fourth flat portion 103. In some embodiments, the first opening 105 and the second opening 106 are formed to have a substantially triangular shape. The shape of the housing 100 is not limited to the illustrated example and all shapes may be applied as long as the housing 100 is configured to support the flexible display panel 200 and the guide member 300 in a slidable state.

The sliding member 400 is installed between the third flat portion 102 and the fourth flat portion 103 to be connected to the housing 100 and the guide member 300 and controls the extension and retraction of the flexible display panel 200 so that the first flat portion 221 and the second flat portion 222 in opposing directions by the same distance.

Figure 4:
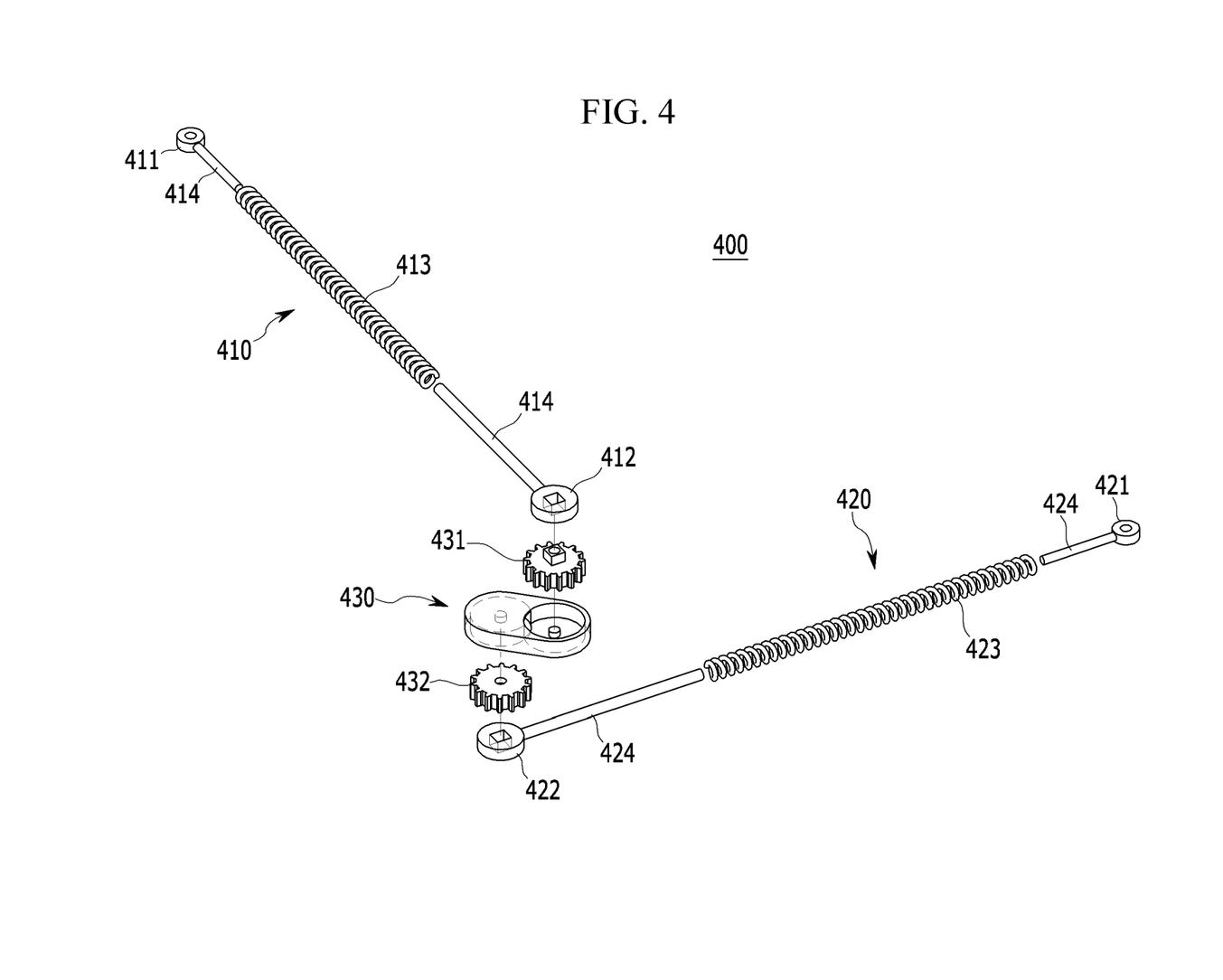
FIG. 4 is an exploded perspective view of the sliding member illustrated in FIG. 1.

FIG. 4 is an exploded perspective view of the sliding member illustrated in FIG. 1.

Referring to FIGS. 1 to 4, the sliding member 400 includes a first shaft 410 which is compressible and extendable, a first gear 431 rotating in conjugation with the first shaft 410, a second gear 432 rotating by engagement with the first gear 431, and a second shaft 420 which is connected to the second gear 432 and is compressible and extendable. The first gear 431 and the second gear 432 are housed in a gear box 430 and the gear box 430 can be fixed to the side portion 120 of the housing 100.

The first shaft 410 includes a first fixing portion 411 fixed to the first plate 301, a first rotating portion 412 connected to the first gear 431, and a first compress spring or first compression spring 413 both ends of which are respectively fixed to the first fixing portion 411 and the first rotating portion 412. A pair of first pins 414 which are respectively fixed to the first fixing portion 411 and the first rotating portion 412 are positioned inside the first compress spring 413.

The distance between the pair of first pins 414 can be changed according to the degree of compression of the first compress spring 413. For example, the pair of first pins 414 can be positioned to contact or be closer to each other when the first compress spring 413 is compressed and to be far away from each other when the first compress spring 413 is extended.

The second shaft 420 includes a second fixing portion 421 fixed to the second plate 302, a second rotating portion 422 connected the second gear 432, and a second compress spring or second compression spring 423 both ends of which are respectively fixed to the second fixing portion 421 and the second rotating portion 422. A pair of second pins which are respectively fixed to the second fixing portion and the second rotating portion are positioned inside the second compress spring 423.

The gear box 430 forms two spaces for housing the first and second gears 431 and 432 and the space for housing the first gear 431 can be opened upward and the space for receiving the second gear 432 can be opened downward. In addition, the center of the gear box 430 is opened such that the first gear 431 and the second gear 432 engage with each other. When the first gear 431 rotates, the second gear 432 rotates in an opposite direction by the amount of rotation as the first gear 431.

The first rotating portion 412 is fixed to the top of the first gear 431 and the second rotating portion 422 is fixed to the bottom of the second gear 432. The second gear 432 is positioned to be closer to the curved portion 101 than the first gear 431, and in the closed state, the first fixing portion 411 is positioned to be closer to the curved portion 101 than the second fixing portion 421. Accordingly, in the closed state, the first shaft 410 and the second shaft 420 cross each other, and even though the first and second shafts 410 and 420 cross each other, there is a difference in height between the first and second shafts 410 and 420, and as a result, there is no interference between the first and second shafts 410 and 420.

Figure 5:
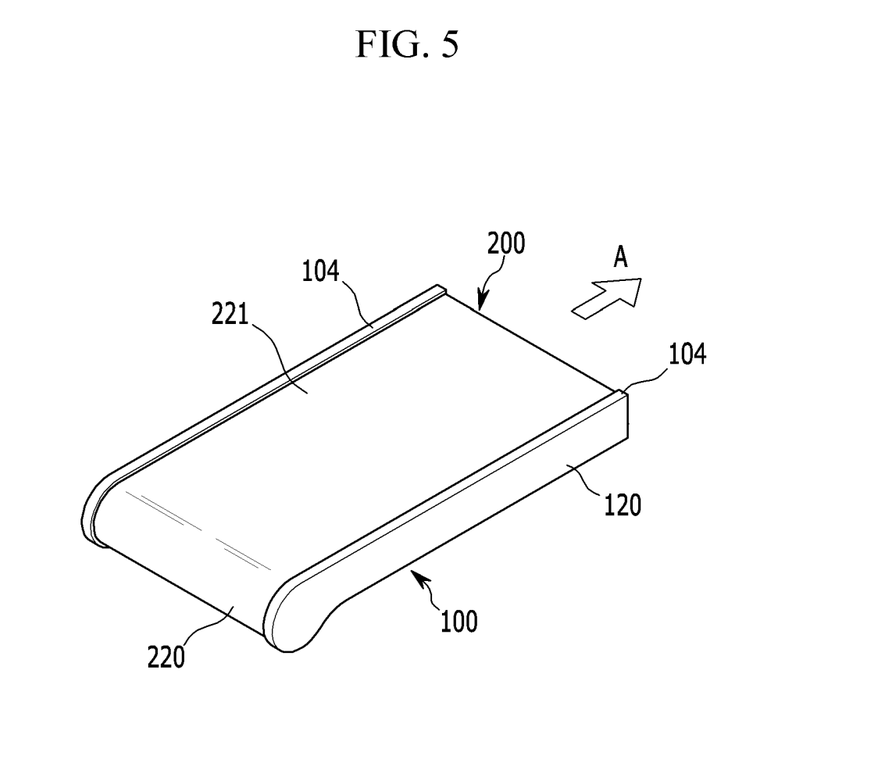
FIGS. 5 and 6 are perspective views illustrating the flexible display in a closed state.
Figure 6:
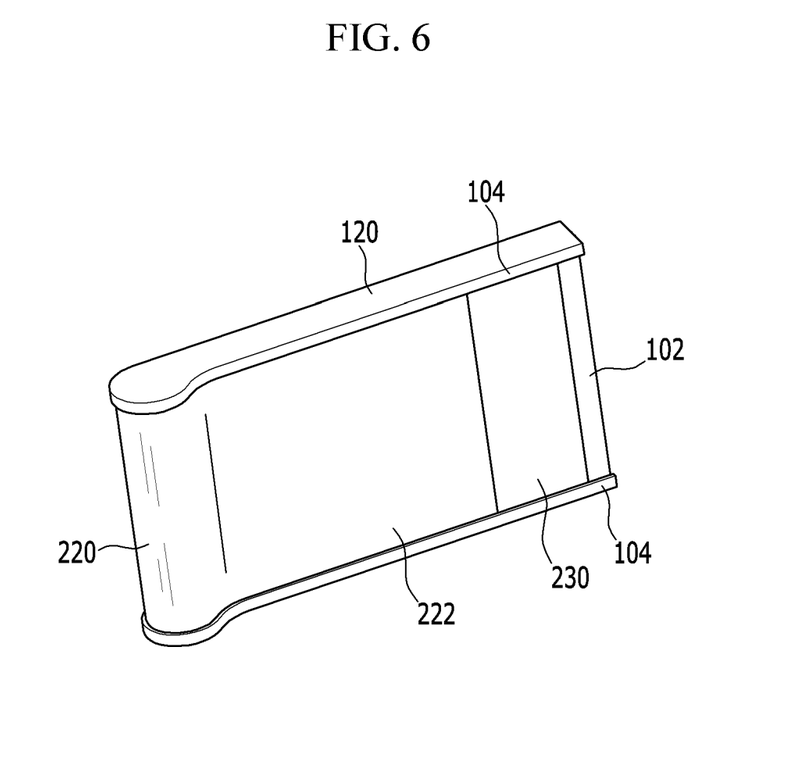
Figure 7:
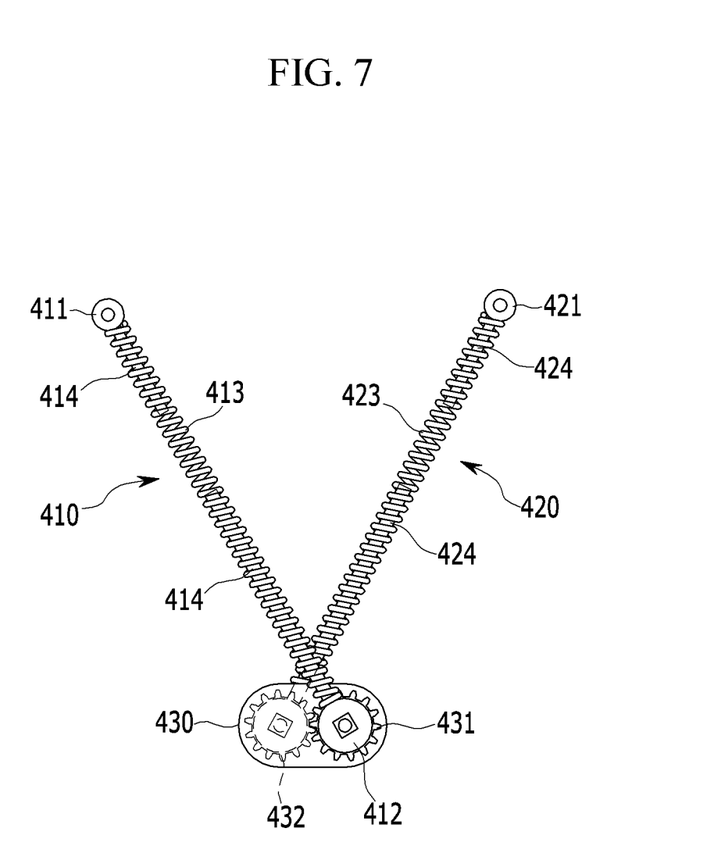
FIG. 7 is a plan view illustrating the sliding member in a closed state.

FIGS. 5 and 6 are perspective views illustrating the flexible display in a closed state. FIG. 7 is a plan view illustrating the sliding member in a closed state.

Referring to FIGS. 5 to 7, in the closed state, the first flat portion 221 has a minimum size and the display area in which the image is displayed can be the entire first flat portion 221 and a part of the bending portion 220. In the closed state, the first shaft 410 and the second shaft 420 cross each other.

In the closed state, when the user pulls the edge of the first flat portion 221 in the first direction (arrow A), the first flat portion 221 is slid in the first direction due to the pulling force of the user and thus the area thereof is gradually increased. The first plate 301 of the guide member 300 is also simultaneously slid in the first direction with the first flat portion 221.

Figure 8:
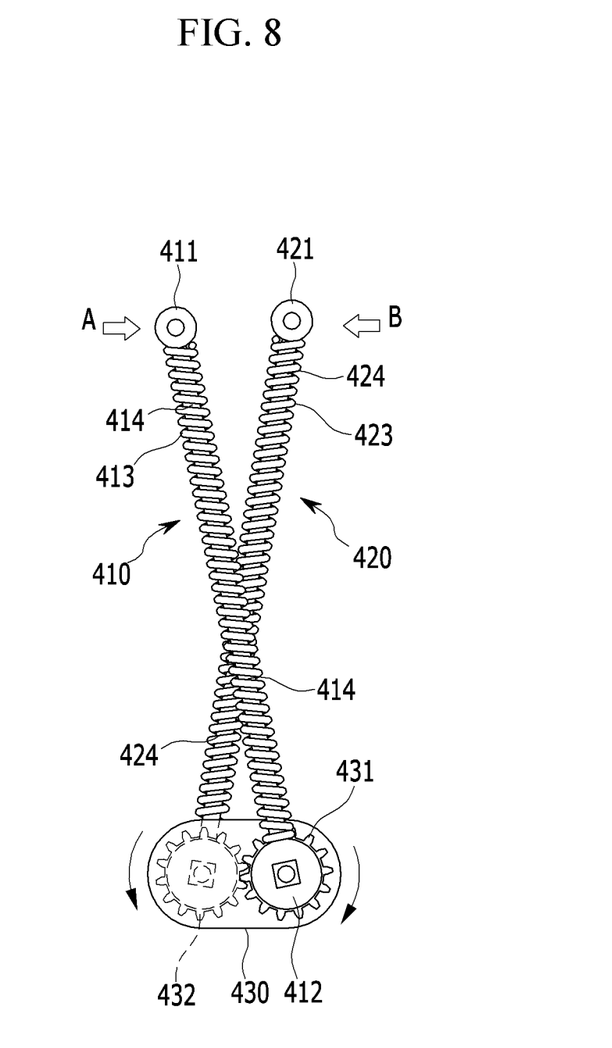
FIG. 8 is a plan view illustrating the sliding member in a middle state between a closed state and an opened state.

FIG. 8 is a plan view illustrating the sliding member in a middle state between a closed state and an opened state.

Referring to FIG. 8, the first fixing portion 411 is also slid in the first direction by sliding of the first plate 301 and as the distance between the first fixing portion 411 and the first rotating portion 412 is decreased, the first compress spring 413 is compressed. Simultaneously, the first rotating portion 412 and the first gear 431 rotate in a clockwise direction and the second gear 432 engaged with the first gear 431 rotates in a counterclockwise direction.

While the second compress spring 423 rotates in the counterclockwise direction based on the second rotating portion 422 by rotating the second gear 432, the second fixing portion 421 is slid in the second direction (arrow B) and the second compress spring 423 is compressed. The distances that each of the first fixing portion 411 and the second fixing portion 421 move are substantially the same as each other. Similarly, the degree of compression of the first and second compress springs 413 and 423 are substantially the same as each other.

Figure 9:
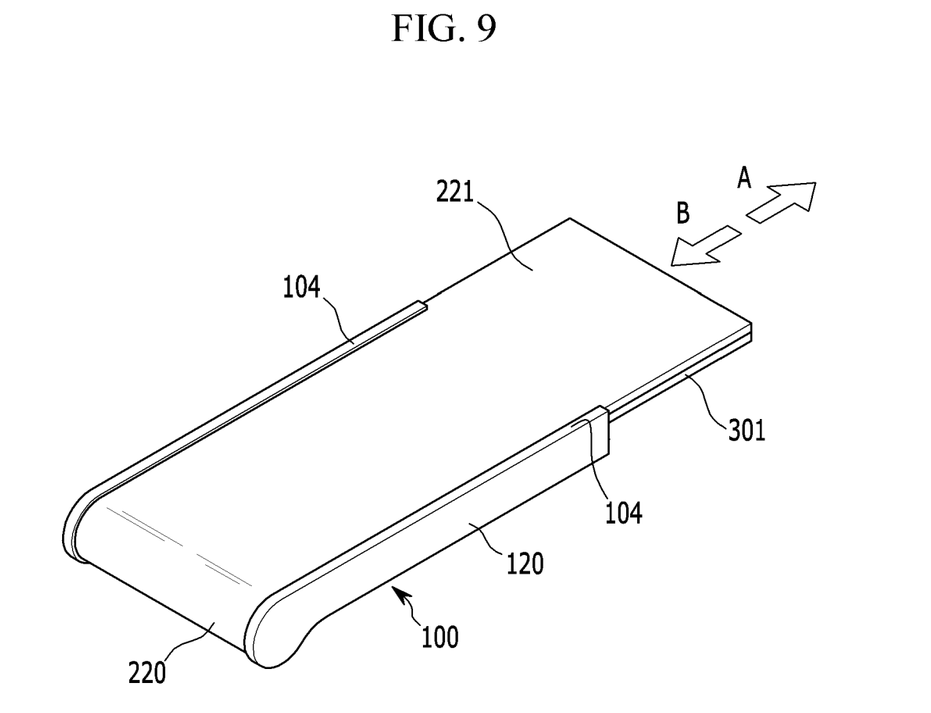
FIGS. 9 and 10 are perspective views illustrating the flexible display in an opened state.
Figure 10:
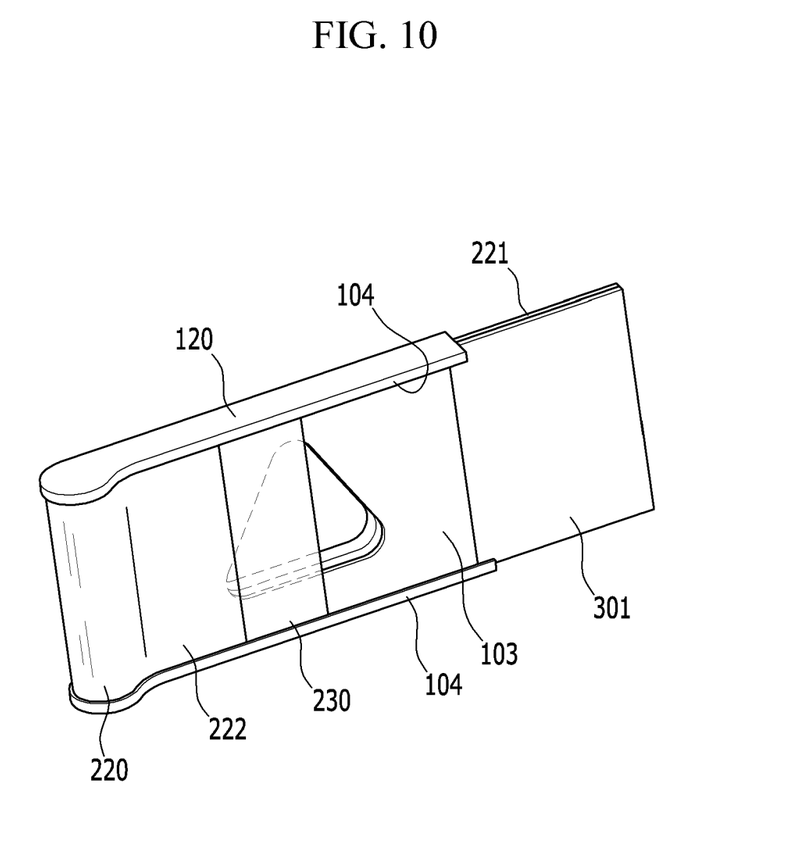
Figure 11:
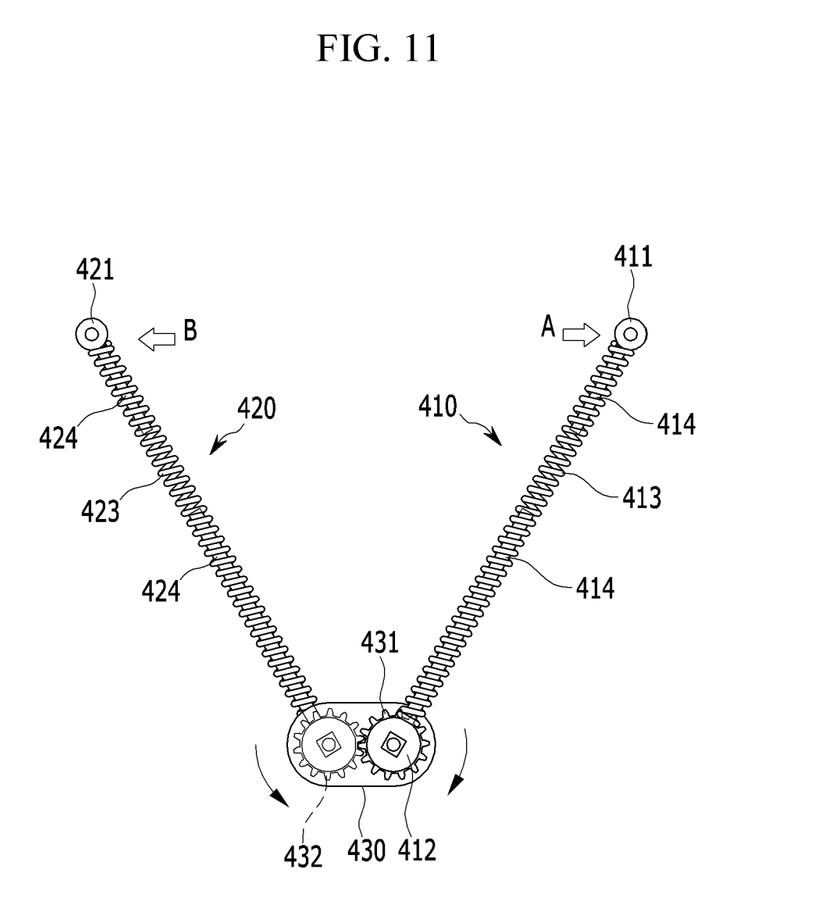
FIG. 11 is a plan view illustrating the sliding member in an opened state.

FIGS. 9 and 10 are perspective views illustrating the flexible display in an opened state. FIG. 11 is a plan view illustrating the sliding member in an opened state.

Referring to FIGS. 9 to 11, when the user pulls the edge of the first flat portion 221 to the end in the first direction (arrow A), the first flat portion 221 is slid in the first direction and thus the area thereof is a maximum. The first plate 301 and the first fixing portion 411 are also slid in the first direction together with the first flat portion 221, and as the distance between the first fixing portion 411 and the first rotating portion 412 is increased, the first compress spring 413 is extended.

Simultaneously, the first rotating portion 412 and the first gear 431 rotate in a clockwise direction and the second gear 432 rotates in a counterclockwise direction. While the second compress spring 423 rotates in the counterclockwise direction based on the second rotating portion 422 by rotating the second gear 432, the second fixing portion 421 is slid in the second direction (arrow B) and the second compress spring 423 is compressed.

In some embodiments, a grip (not illustrated) or the like is provided at the edge of the first flat portion 221, and as a result, the user can slide the flexible display panel 200 without directly touching the first flat portion 221. The rotation of the first shaft 410 is guided by the first opening 105, and the rotation of the second shaft 420 is guided by the second opening 106.

As such, when the user pulls the first flat portion 221 in the first direction (arrow A), the second flat portion 222 moves in the opposite direction by substantially the same distance as the first flat portion 221 due to the operation of the aforementioned sliding member 400. On the contrary, in the opened state, when the user pushes the first flat portion 221 in the second direction (arrow B), the flexible display panel is restored to the closed state through an opposite process to the aforementioned process, and even in this situation, the second flat portion 222 moves in the opposite direction by substantially the same distance as the first flat portion 221.

Accordingly, the flexible display 10 of at least one exemplary embodiment operates by a semi-automatic sliding method and may minimize the stress applied to the flexible display panel 200. In contrast, in the standard flexible display the force when tension is applied is smoothly transferred, but the force when compression is applied is not smoothly transferred, and as a result, the flexible display can be deformed.

That is, in the opened state, when the user pushes the first flat portion 221 in the second direction (arrow B), the compression is applied to the flexible display panel 200. However, the first plate 301 stably supports the first flat portion 221, the second plate 302 and second flat portion 222 are rapidly slid in the first direction (arrow A) by the operation of the sliding member 400, and as a result, compression is not applied to the flexible display panel 200.

Accordingly, it is possible to prevent the deformation of the flexible display from occurring by reducing the stress applied to the flexible display panel 200 and increase the lifespan of the flexible display panel 200. Further, the flexible display 10 of the exemplary embodiment operates by the semi-automatic sliding method, and as a result, a similar effect to an existing keypad-type sliding phone can be provided.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display, comprising: a flexible display panel including: i) a first flat portion, ii) a bending portion connected to the first flat portion, and iii) a second flat portion connected to the bending portion and opposing the first flat portion;
   a guide member supporting the flexible display panel and arranged between the first and second flat portions;
   a housing supporting the flexible display panel and the guide member and arranged between the first and second flat portions; and
   a sliding member connected to the housing and the guide member and configured to move the second flat portion by substantially the same distance as and in an opposite direction to the first flat portion when the first flat portion is moved,
   wherein the first portion is configured to be: i) slid in a first direction via a pulling force so as to have a maximum area in an opened state and ii) slid in a second direction opposite to the first direction via a pushing force so as to have a minimum area in a closed state.

2. The flexible display of claim 1, wherein the flexible display panel is folded in a length direction thereof and wherein the first flat portion, the bending portion, and the second flat portion are sequentially arranged.

3. The flexible display of claim 2, wherein the flexible display panel includes a flexible substrate and a display unit formed over the flexible substrate and wherein a portion of the display unit corresponding to the first flat portion is configured to display an image.

4. The flexible display of claim 1, wherein the sliding member comprises:
   a first shaft having a first end fixed to the first flat portion via the guide member, wherein the first shaft is compressible and extendable;
   a gear box including: i) a first gear configured to rotate with the first shaft and ii) a second gear engaged with the first gear; and
   a second shaft connected to the second gear and having a first end fixed to the second flat portion via the guide member, wherein the second shaft is compressible and extendable.

5. The flexible display of claim 4, wherein the guide member comprises:
   a first plate overlapping and fixed to the first flat portion;
   a second plate fixed to an edge of the second flat portion; and
   a connecting portion connecting the first plate to the second plate,
   wherein the first end of the first shaft and the first end of the second shaft are respectively fixed to the first plate and the second plate.

6. The flexible display of claim 5, wherein the flexible display panel includes a printed circuit board connected to the edge of the second flat portion and overlapping the second plate.

7. The flexible display of claim 5, wherein the housing includes a curved portion and wherein the bending portion and the connecting portion contact the curved portion.

8. The flexible display of claim 7, wherein the housing comprises:
   a support comprising a third flat portion, the curved portion, and a fourth flat portion which are integrally connected;
   a pair of side portions fixed to opposing sides of the support; and
   a guide protrusion overlapping an edge of the flexible display panel and formed along at least one of the side portions.

9. The flexible display of claim 8, wherein the third and fourth flat portions are interposed between the first and second plates wherein a first opening and a second opening are respectively formed in the third flat portion and the fourth flat portion, and wherein the sliding member is placed in the first and second openings.

10. The flexible display of claim 5, wherein the first shaft comprises:
    a first fixing portion fixed to the first plate;
    a first rotating portion connected to the first gear; and
    a first compression spring connecting the first fixing portion to the first rotating portion,
    wherein the second shaft comprises:
    a second fixing portion fixed to the second plate;
    a second rotating portion connected to the second gear; and
    a second compression spring connecting the second fixing portion to the second rotating portion.

11. The flexible display of claim 10, wherein the first shaft further comprises a pair of first pins respectively fixed to the first fixing portion and the first rotating portion, wherein the pair of first pins are positioned inside the first compression spring, wherein the second shaft further comprises a pair of second pins respectively fixed to the second fixing portion and the second rotating portion, and wherein the pair of second pins are positioned inside the second compression spring.

12. The flexible display of claim 10, wherein the gear box is fixed to the housing and defines two spaces for respectively housing the first gear and the second gear.

13. The flexible display of claim 12, wherein the space housing the first gear and the space housing the second gear are opened in opposing directions, wherein the first and second rotating portions are respectively connected to opposing sides of the first and second gears, and wherein the first shaft and the second shaft are arranged at different heights.

14. The flexible display of claim 4, wherein when the first flat portion is slid in the first direction: i) the first gear and the second gear rotate in opposing directions, ii) the first shaft is compressed and then extended, iii) the second flat portion is slid in the second direction, and iv) the second shaft is compressed and then extended.

15. The flexible display of claim 4, wherein when the first flat portion is slid in the second direction: i) the first gear and the second gear rotate in opposing directions, ii) the first shaft is compressed and then extended, iii) the second flat portion is slid in the first direction, and iv) the second shaft is compressed and then extended.

16. A flexible display, comprising:
   a flexible display panel including: i) a first flat portion, ii) a bending portion connected to the first flat portion, and iii) a second flat portion connected to the bending portion and opposing the first flat portion;
   a housing supporting the flexible display panel; and
   a sliding member including:
      a first shaft having a first end fixed to the first flat portion, wherein the first shaft is compressible and extendable;
      a first gear connected to a second end of the first shaft;
      a second gear rotatably engaged to the first gear; and
      a second shaft having a first end connected to the second flat portion and a second end connected to the second gear, wherein the second shaft is compressible and extendable,
      wherein when a user exerts a force on the first portion: i) at least a portion of the force is transferred to the second flat portion via the sliding member and ii) the second flat portion moves by substantially the same distance and in the opposite direction to the first flat portion.

17. The flexible display of claim 16, wherein the first gear and the second gear are fixed to the housing.

* * * * *